United States Patent
Kim et al.

(10) Patent No.: US 8,856,612 B2
(45) Date of Patent: Oct. 7, 2014

(54) METHOD AND APPARATUS FOR INTERLEAVING DATA IN A MOBILE COMMUNICATION SYSTEM

(71) Applicant: Samsung Electronics Co. Ltd., Suwon-si (KR)

(72) Inventors: Young-Bum Kim, Seoul (KR); Joon-Young Cho, Suwon-si (KR); Ju-Ho Lee, Suwon-si (KR); Zhouyue Pi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/974,734

(22) Filed: Aug. 23, 2013

(65) Prior Publication Data

US 2013/0346827 A1    Dec. 26, 2013

Related U.S. Application Data

(63) Continuation of application No. 12/244,321, filed on Oct. 2, 2008, now Pat. No. 8,266,500, and a continuation of application No. 13/584,109, filed on Aug. 13, 2012, now Pat. No. 8,522,112, which is a continuation of application No. 12/244,321, filed on Oct. 2, 2008, now Pat. No. 8,266,500.

(30) Foreign Application Priority Data

Oct. 4, 2007    (KR) .................... 10-2007-0100054

(51) Int. Cl.
   *H03M 13/00*    (2006.01)
   *H03M 13/27*    (2006.01)
   *H04L 1/00*    (2006.01)

(52) U.S. Cl.
   CPC ........... *H03M 13/271* (2013.01); *H04L 1/0071* (2013.01); *H04L 1/0042* (2013.01); *H03M 13/6525* (2013.01)
   USPC .......................... 714/762; 714/788; 370/336

(58) Field of Classification Search
   CPC ... H04L 1/0028; H04L 1/0003; H04L 1/0009; H04L 1/0026; H04L 1/1861
   USPC ........... 714/758, 763, 702, 762, 788; 370/336
   See application file for complete search history.

(56) References Cited

U.S. PATENT DOCUMENTS

| 5,940,863 A | 8/1999 | Fimoff et al. |
| 6,298,463 B1 | 10/2001 | Bingeman et al. |

(Continued)

FOREIGN PATENT DOCUMENTS

| EP | 1 124 344 A1 | 8/2001 |
| EP | 1 542 368 A1 | 6/2005 |

(Continued)

OTHER PUBLICATIONS

R1-073361, Uplink channel interleaving, 3GPPTSG RAN1 #50, Athens, Greece, Aug. 20-24, 2007, R1-073361.

(Continued)

*Primary Examiner* — Guy Lamarre
(74) *Attorney, Agent, or Firm* — Jefferson IP Law, LLP

(57) ABSTRACT

An interleaving method in a mobile communication system is provided. The interleaving method includes encoding a plurality of bits to output encoded bits in a sequence, interleaving the encoded bits based on a modulation order to generate interleaved encoded bits comprising consecutive bits having a size based on the modulation order, the consecutive bits corresponding to consecutive bits of the encoded bits, scrambling the interleaved encoded bits with a scrambling code to generate scrambled bits, and modulating the scrambled bits based on the modulation order to output at least one symbol.

28 Claims, 18 Drawing Sheets

(56) References Cited

U.S. PATENT DOCUMENTS

| | | | |
|---|---|---|---|
| 6,512,759 B1 * | 1/2003 | Hashimoto et al. | 370/347 |
| 6,564,343 B1 | 5/2003 | Yamashita | |
| 6,631,491 B1 | 10/2003 | Shibutani et al. | |
| 6,977,884 B2 | 12/2005 | Sakoda et al. | |
| 6,992,973 B2 | 1/2006 | Sakoda et al. | |
| 7,260,761 B2 | 8/2007 | Dottling et al. | |
| 2003/0091098 A1 * | 5/2003 | Manninen et al. | 375/133 |
| 2003/0149848 A1 | 8/2003 | Ibrahim et al. | |
| 2003/0149849 A1 | 8/2003 | Kim et al. | |
| 2003/0159100 A1 * | 8/2003 | Buckley et al. | 714/758 |
| 2006/0224934 A1 * | 10/2006 | Cameron et al. | 714/752 |
| 2007/0274318 A1 | 11/2007 | Ochiai | |
| 2009/0092118 A1 | 4/2009 | Naka et al. | |
| 2009/0100300 A1 | 4/2009 | Kim et al. | |
| 2010/0091910 A1 | 4/2010 | Mukai et al. | |
| 2010/0107032 A1 * | 4/2010 | Eroz et al. | 714/752 |

FOREIGN PATENT DOCUMENTS

| | | |
|---|---|---|
| EP | 1 819 079 A1 | 8/2007 |
| JP | 2000-244335 A | 9/2000 |
| JP | 2004-320434 A | 11/2004 |
| JP | 2005-514858 A | 5/2005 |
| JP | 2008-205801 A | 9/2008 |
| JP | 5 300 853 B2 | 6/2013 |
| KR | 10-2000-0042759 A | 7/2000 |
| KR | 10-2007-0075650 A | 7/2007 |
| RU | 2 189 629 C2 | 9/2001 |
| RU | 2 274 950 C2 | 4/2006 |
| WO | 99/25069 A1 | 5/1999 |
| WO | 03/069784 A1 | 8/2003 |
| WO | 2006/067972 A1 | 6/2006 |

OTHER PUBLICATIONS

LG Electronics, R1-072332, 3GPP TSG RAN WG 1 Meeting #49, Circular buffer based rate matching for E-UTRAN, May 7-11, 2007, Kobe, Japan.
Motorola, Uplink channel interleaving, 3GPP R1-072671, Jun. 29, 2007.
Alcatel-Lucent, Flexible channel interleaver for E-UTR A[online], 3GPP R1-071426, Mar. 30, 2007.
Ntt DoCoMo et al., "Performance Evaluations for Prime InterLeaver(PIL)"; 3GPP TSGR1#4(99)470; Apr. 20, 1999.
ZTE; "LTE channel interleaving" 3GPP R1-073166; Jun. 29, 2007.
Samsung; "Row-col. based channel interleaver for E-UTRA"; 3GPP R1-073129; Jun. 29, 2007.
Motorola, "UL L1/L2 Control Signals with Data: Multiplexing Detail"; 3GPP R1-073388; Aug. 24, 2007.
Qualcomm Europe; "Rate matching details for control and data multiplexing"; 3GPP R1-073269; Aug. 24, 2007.

* cited by examiner

US 8,856,612 B2

METHOD AND APPARATUS FOR INTERLEAVING DATA IN A MOBILE COMMUNICATION SYSTEM

CROSS-REFERENCE TO RELATED APPLICATIONS

This application is a continuation of U.S. patent application Ser. No. 13/584,109, filed on Aug. 13, 2012 and issued under U.S. Pat. No. 8,522,112, which is a continuation of U.S. patent application Ser. No. 12/244,321, which was filed on Oct. 2, 2008 and issued under U.S. Pat. No. 8,266,500, which claims priority from Korean Patent Application No. 10-2007-0100054, filed on Oct. 4, 2007 in the Korean Intellectual Property Office, the entire disclosure of each of which is hereby incorporated by reference.

BACKGROUND OF THE INVENTION

1. Field of the Invention

The present invention relates to a method and apparatus for transmitting data in a next-generation mobile communication system. More particularly, the present invention relates to a method and apparatus for interleaving data in a mobile communication system.

2. Description of the Related Art

With respect to mobile communication systems, intensive research is being conducted on Orthogonal Frequency Division Multiple Access (OFDMA) and Single Carrier-Frequency Division Multiple Access (SC-FDMA) as schemes useful for high-speed data transmission in a wireless channel.

At present, $3^{rd}$ Generation Partnership Project (3GPP), the standards group for asynchronous cellular mobile communications, is studying Long Term Evolution (LTE) or the Evolved Universal Terrestrial Radio Access (E-UTRA) system, which is the next-generation mobile communication system, based on the above-stated multiple access schemes.

A multiple access scheme generally allocates and manages time-frequency resources on which it will carry data or control information for each user separately so that they do not overlap each other, i.e., they keep orthogonality, thereby distinguishing data or control information for each user. For control channels, the multiple access scheme can additionally allocate code resources, thereby distinguishing control information for each user.

FIG. 1 is a diagram illustrating time-frequency resource and subframe structure for transmitting data or control information on an uplink in a conventional 3GPP LTE system. In FIG. 1, the horizontal axis represents a time domain and the vertical axis represents a frequency domain.

Referring to FIG. 1, the minimum transmission unit in the time domain is an SC-FDMA symbol. $N_{symb}$ SC-FDMA symbols 102 constitute one slot 106 and 2 slots constitute one subframe 100. The number $N_{symb}$ of SC-FDMA symbols is variable according to a length of a Cyclic Prefix (CP) that is added to every SC-FDMA symbol for prevention of inter-symbol interference. For example, $N_{symb}=7$ for a normal CP, and $N_{symb}=6$ for an extended CP.

A length of the slot is 0.5 ms and a length of the subframe is 1.0 ms. The minimum transmission unit in the frequency domain is a subcarrier, and the entire system transmission band is composed of a total of $N_{BW}$ subcarriers 104. $N_{BW}$ is a value that is in proportion to the system transmission band. For example, $N_{BW}=600$ for the 10-MHz transmission band.

In the time-frequency domain, the basic unit of resources is a Resource Element (RE) 112, that can be indicated by a subcarrier index k and an SC-FDMA symbol index l, wherein l has a value between 0 114 and $N_{symb}-1$ 116. A Resource Block (RB) 108 is defined by $N_{symb}$ consecutive SC-FDMA symbols 102 in the time domain and $N_{RB}$ consecutive subcarriers 110 in the frequency domain. Therefore, one RB 108 is composed of $N_{symb}*N_{RB}$ REs 112. Resources for data transmission are scheduled in the time domain by an Evolved Node B (ENB), also known as a Base Station (BS), in units of 2 consecutive RBs.

FIG. 2 is a diagram illustrating a subframe structure for $N_{symb}=7$ in a conventional 3GPP LTE system.

Referring to FIG. 2, a subframe 202, which is a basic transmission unit of the uplink, has a 1-ms length, and one subframe is composed of two 0.5-ms slots 204 and 206. The slots 204 and 206 are each composed of a plurality of SC-FDMA symbols 211~224. In an example of FIG. 2, in one subframe 202, data is transmitted in SC-FDMA symbols indicated by reference numerals 211, 212, 213, 215, 216, 217, 218, 219, 220, 222, 223 and 224, and pilots (also referred to as a Reference Signal (RS)) are transmitted in SC-FDMA symbols indicated by reference numerals 214 and 221. Therefore, for one subframe, there are a total of 12 SC-FDMA symbols for data transmission. The pilot, composed of a predefined sequence, is used for channel estimation for coherent demodulation at the receiver. The number of SC-FDMA symbols for control information transmission, the number of SC-FDMA symbols for RS transmission, and their positions in the subframe are given herein by way of example, and these are subject to change according to the system operation.

The LTE system employs turbo coding as an error correcting coding or channel coding method for increasing reception reliability of data. For optimized realization, the maximum size Z of an input bit stream (hereinafter referred to as 'code block') of a turbo code may not exceed 6144 bits. Therefore, when the amount of desired transmission data is greater than 6144 bits, the LTE system segments the desired transmission data into a plurality of code blocks, and then channel-codes the code blocks individually. It is characterized that a size of the code block is a multiple of 8. The channel-coded code blocks each undergo rate matching on a code block by code block basis, so that their sizes are adjusted to be matched with the amount of allocated resources. There is an additional need for an interleaving operation for making the code blocks be robust against a burst error on a wireless transmission path, and a modulation operation for increasing the spectral efficiency. The interleaving operation combines a plurality of code blocks and processes them, and the modulation operation is performed on the code blocks individually, thereby preventing the possible case where symbols of different code blocks constitute one modulation symbol.

However, a definition of the detailed interleaving operation is not given in the LTE system.

SUMMARY OF THE INVENTION

An aspect of the present invention is to address at least the above-mentioned problems and/or disadvantages and to provide at least the advantages described below. Accordingly, an aspect of the present invention is to provide an interleaving method and apparatus for increasing reception reliability of transmission data in a Long Term Evolution (LTE) system.

According to one aspect of the present invention, an interleaving method in a mobile communication system is provided. The interleaving method includes encoding a plurality of bits to output encoded bits in a sequence, interleaving the encoded bits based on a modulation order to generate interleaved encoded bits comprising consecutive bits having a size based on the modulation order, the consecutive bits corresponding to consecutive bits of the encoded bits, scrambling the interleaved encoded bits with a scrambling code to generate scrambled bits, and modulating the scrambled bits based on the modulation order to output at least one symbol.

According to another aspect of the present invention, a deinterleaving method in a mobile communication system is provided. The method includes demodulating received symbols to output scrambled bits, descrambling the scrambled bits according to a scrambling code to output interleaved encoded bits, deinterleaving the interleaved encoded bits based on a modulation order to generate encoded bits, the interleaved encoded bits comprising consecutive bits having a size based on the modulation order, the consecutive bits corresponding to consecutive bits of the encoded bits, and decoding the encoded bits to output a plurality of bits in a sequence.

According to another aspect of the present invention, an interleaving apparatus in a mobile communication system is provided. The apparatus includes an encoder encoding a plurality of bits to output encoded bits in a sequence, an interleaver interleaving the encoded bits based on a modulation order to generate interleaved encoded bits comprising consecutive bits having a size based on the modulation order, the consecutive bits corresponding to consecutive bits of the encoded bits, a scrambler scrambling the interleaved encoded bits with a scrambling code to generate scrambled bits, and a modulator modulating the scrambled bits based on the modulation order to output at least one symbol.

According to another aspect of the present invention, a deinterleaving apparatus in a mobile communication system is provided, the apparatus includes a demodulator demodulating received symbols to output scrambled bits, a descrambler descrambling the scrambled bits according to a scrambling code to output interleaved encoded bits, a deinterleaver deinterleaving the interleaved encoded bits based on a modulation order to generate encoded bits, the interleaved encoded bits comprising consecutive bits having a size based on the modulation order, the consecutive bits corresponding to consecutive bits of the encoded bits, and a decoder decoding the encoded bits to output a plurality of bits in a sequence.

According to another aspect of the present invention, an interleaving method to which time-first-mapping is applied in a mobile communication system is provided. The method includes encoding a plurality of bits to output encoded bits in a certain sequence, interleaving the encoded bits according to a modulation order to generate interleaved encoded bits, the interleaved encoded bits comprising groups of encoded bits having a size based on the modulation order, scrambling the interleaved encoded bits with a scrambling code to generate scrambled bits, and modulating the scrambled bits to output at least one symbol.

According to another aspect of the present invention, a deinterleaving method to which time-first-mapping is applied in a mobile communication system is provided. The method includes demodulating received symbols to output scrambled bits, descrambling the scrambled bits according to a scrambling code to output interleaved encoded bits, deinterleaving the interleaved encoded bits according to a modulation order to generate encoded bits, the interleaved encoded bits comprising groups of encoded bits having a size based on a modulation order, and decoding the encoded bits to output a plurality of bits in a certain sequence.

According to another aspect of the present invention, an interleaving apparatus to which time-first-mapping is applied in a mobile communication system is provided. The apparatus includes an encoder encoding a plurality of bits to output encoded bits in a certain sequence, an interleaver interleaving the encoded bits according to a modulation order to generate interleaved encoded bits, the interleaved encoded bits comprising groups of encoded bits having a size based on the modulation order, a scrambler scrambling the interleaved encoded bits with a scrambling code to generate scrambled bits, and a modulator modulating the scrambled bits to output at least one symbol.

According to another aspect of the present invention, an apparatus for deinterleaving a received signal to which time-first-mapping is applied in a mobile communication system is provided. The apparatus includes a demodulator demodulating received symbols to output scrambled bits, a descrambler descrambling the scrambled bits according to a scrambling code to output interleaved encoded bits, a deinterleaver deinterleaving the interleaved encoded bits according to a modulation order to generate encoded bits, the interleaved encoded bits comprising groups of encoded bits having a size based on a modulation order, and a decoder decoding the encoded bits to output a plurality of bits in a certain sequence.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness. Terms used herein are defined based on functions in the exemplary embodiments of the present invention and may vary according to users, operators' intention or usual practices. Therefore, the definition of the terms should be made based on the contents throughout the specification.

Although a description of exemplary embodiments of the present invention will be made herein on an assumption that a User Equipment (UE), also known as a Mobile Station (MS), transmits data on the uplink in a cellular communication system based on the Long Term Evolution (LTE) system, it is noted that the present invention is not limited to a particular transmission system or a transmission direction (uplink or downlink) of data.

Figure 1:
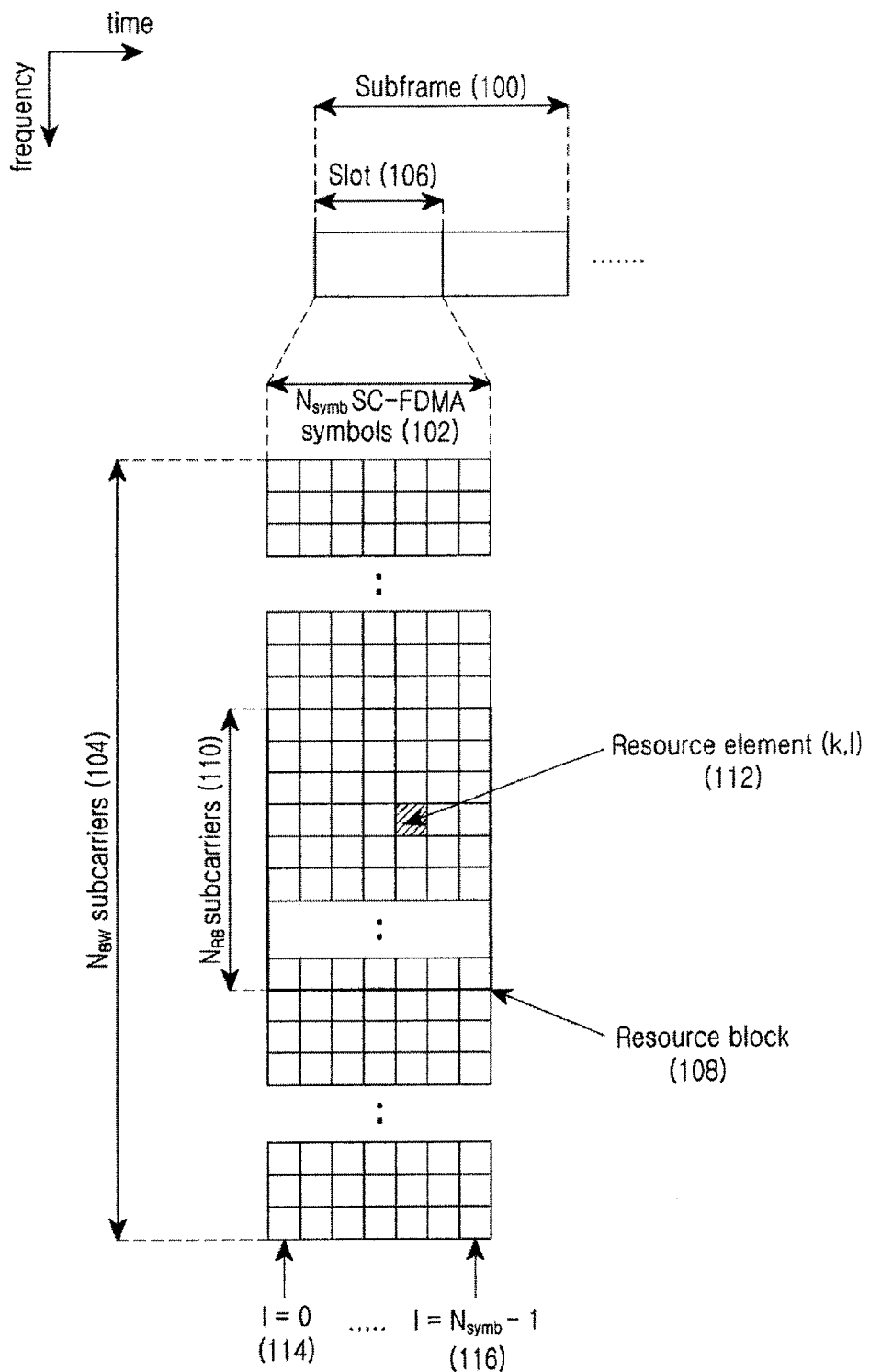
FIG. 1 is a diagram illustrating time-frequency resource and subframe structure in a conventional Long Term Evolution (LTE) system.
Figure 2:
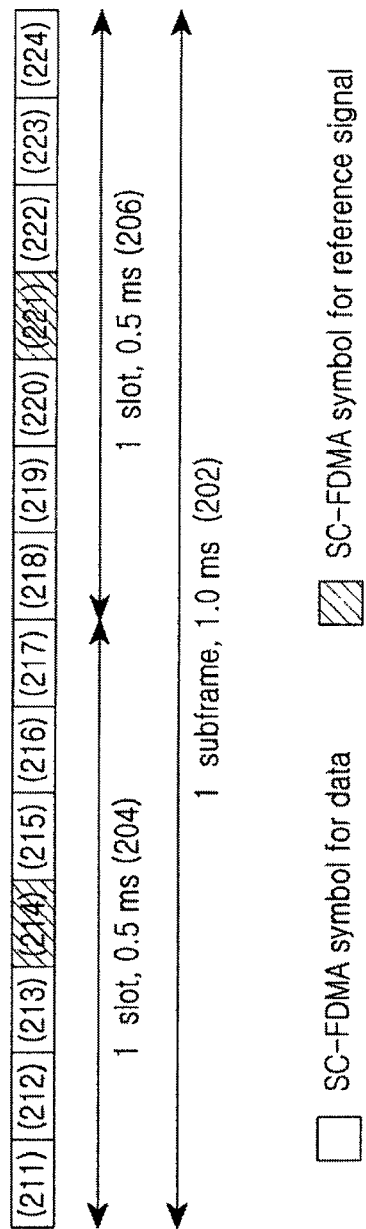
FIG. 2 is a diagram illustrating an example of a subframe structure in a conventional LTE system.
Figure 3:
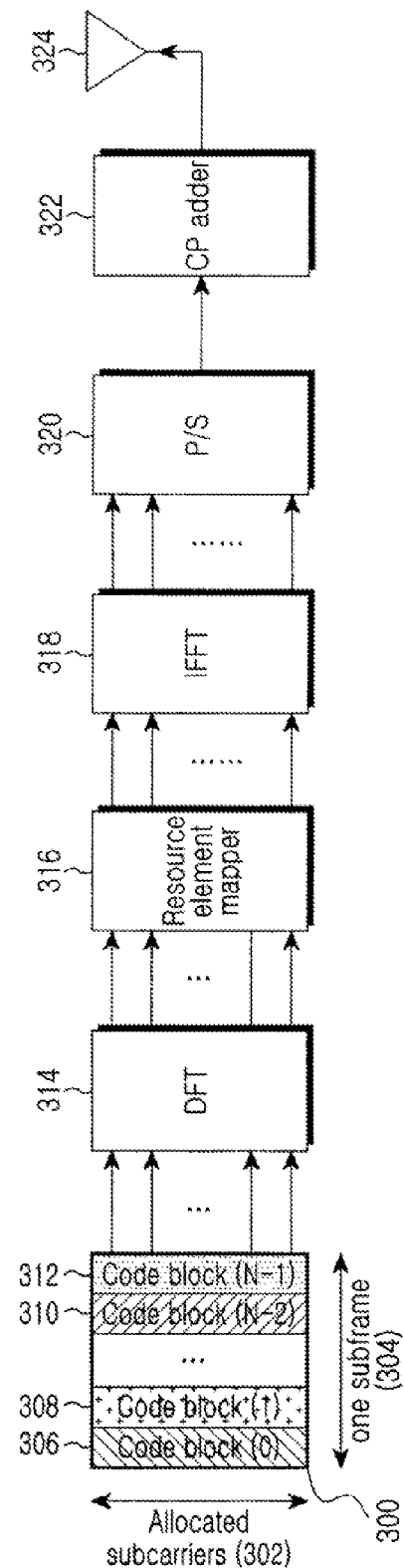
FIG. 3 is a data transmission block diagram to which a frequency-first-mapping method is applied.
Figure 4:
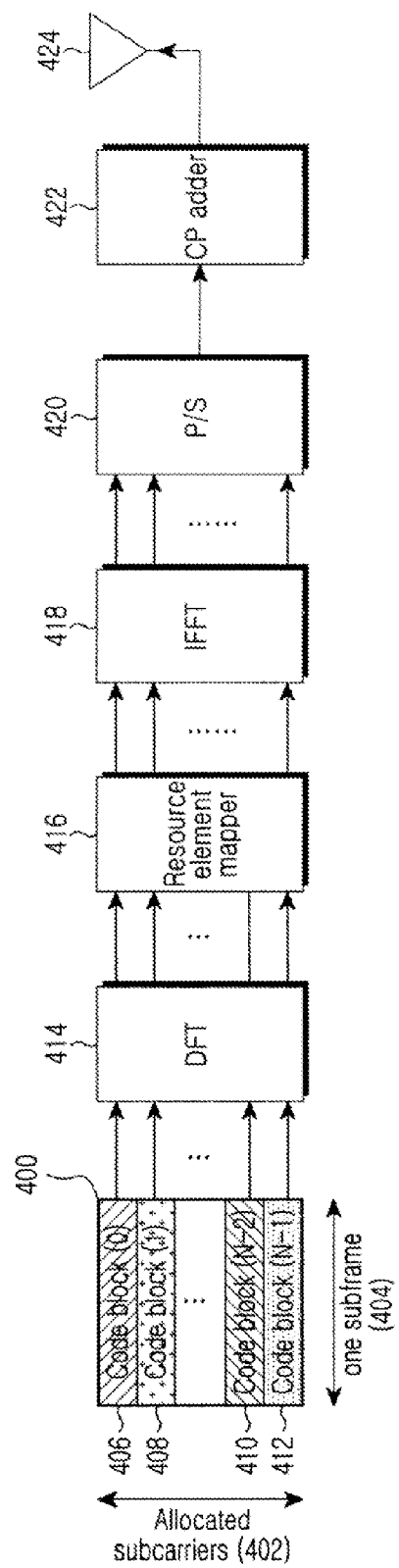
FIG. 4 is a data transmission block diagram to which a time-first-mapping method is applied.

With reference to FIGS. 3 and 4, an operating principle of exemplary embodiments of the present invention will be described. When a number N of code blocks are formed due to the large amount of information for desired transmission data, a method for channel-coding and rate-matching the code blocks individually, and then mapping the code blocks to the allocated time-frequency resources can be classified into a frequency-first-mapping method and a time-first-mapping method.

With reference to a data transmission block diagram of FIG. 3, a description will now be made of the frequency-first-mapping method.

FIG. 3 illustrates an example where the amount of time-frequency resources 300 that a UE is allocated from an Evolved Node B (ENB) is defined by reference numeral 302 in the frequency domain and reference numeral 304 in the time domain.

An ENB may allocate the time-frequency resources on a subframe-by-subframe basis. The frequency-first-mapping method maps symbols in an arbitrary code block to the allocated time-frequency resources in such a manner that it sequentially changes frequency-domain indexes with time-domain indexes fixed. When the frequency-domain indexes are all exhausted in a given time-domain index, the frequency-first-mapping method sequentially increases the time-domain indexes and then preferentially performs symbol mapping again in the frequency domain.

Referring to FIG. 3, a code block (0) 306 is mapped to the first Single Carrier-Frequency Division Multiple Access (SC-FDMA) symbol in the subframe 304 with the frequency-first-mapping method, and a code block (1) 308 is mapped to the second SC-FDMA symbol in the subframe with the frequency-first-mapping method. Finally, a code block (N−2) 310 is mapped to the second to last SC-FDMA symbol in the subframe and a code block (N−1) 312 is mapped to the last SC-FDMA symbol in the subframe with the frequency-first-mapping method.

In the following transmission procedure, the data is transmitted after undergoing signal processing in a Discrete Fourier Transform (DFT) block 314, a resource element mapper 316, and an Inverse Fast Fourier Transform (IFFT) block 318.

The DFT block 314 reads input data in units of SC-FDMA symbols, and outputs a frequency-domain signal through DFT signal processing. The resource element mapper 316 maps a signal received from the DFT block 314 to the frequency-domain resources allocated from the ENB in the entire system transmission band. An output signal of the resource element mapper 316 is transformed into a time-domain signal in the IFFT block 318 through IFFT signal processing, and then converted into a serial signal by means of a Parallel-to-Serial (P/S) converter 320. A Cyclic Prefix (CP) adder (or CP inserter) 322 adds a CP for inter-symbol interference prevention to the serial signal, and then transmits the CP-added data via a transmit antenna 324.

However, in the foregoing frequency-first-mapping method, when the channel environment where data is transmitted is subject to an abrupt time-dependent change within one subframe, a particular code block may be lost as it suffers a poor channel environment. Channel coding is a technology in which, even though partial data in the code block is lost, a receiver can receive the code block without error by using an error correction capability of added redundant information. However, if all or a considerable part of the code block suffers a loss, the loss may exceed the limit of the error correction capability, thereby making it impossible to recover from the error. In this case, Hybrid Automatic Repeat reQuest (HARQ) retransmission occurs, causing an unavoidable waste of wireless resources.

Next, with reference to a data transmission block diagram of FIG. 4, the time-first-mapping method will be described.

FIG. 4 illustrates an example in which the amount of time-frequency resources 400 that a UE is allocated from an ENB is defined by reference numeral 402 in the frequency domain and reference numeral 404 in the time domain. The ENB may allocate the time-frequency resources on a subframe-by-subframe basis.

The time-first-mapping method maps symbols in an arbitrary code block to the allocated time-frequency resources in such a manner that it sequentially changes time-domain indexes with frequency-domain indexes fixed. When the time-domain indexes are all exhausted in a given frequency-domain index, the time-first-mapping method sequentially increases the frequency-domain indexes and then preferentially performs symbol mapping again in the time domain.

Referring to FIG. 4, a code block (0) 406 is mapped to the first subcarrier in the allocated frequency-domain resources with the time-first-mapping method, and a code block (1) 408 is mapped to the second subcarrier in the allocated frequency-domain resources with the time-first-mapping method. Finally, a code block (N−2) 410 is mapped to the second to last subcarrier in the allocated frequency-domain resources with the time-first-mapping method. A code block (N−1) 412 is mapped to the last subcarrier in the allocated frequency-domain resources with the time-first-mapping method. In the following transmission procedure, the data is transmitted after undergoing signal processing in a DFT block 414, a resource element mapper 416, and an IFFT block 418. Since the signal processing procedure after the DFT block 414 is equal to that in FIG. 3, a description thereof will be omitted herein.

The foregoing time-first-mapping method can noticeably reduce the possibility that a particular code block may be completely lost as it experiences the poor channel environment, even though the channel environment in which data is transmitted is subject to an abrupt time-dependent change within one subframe. That is, even though the channel environment is very poor for a particular time period within one subframe, it is restricted below the limit of the error correction capability from the standpoint of an arbitrary code block, so that the receiver can recover the data without error. Thus, in this case, N code blocks all suffer the loss within the limit of the error correction capability, thereby making it possible to recover the data without error. Therefore, the time-first-mapping method, compared with the frequency-first-mapping method, is preferred to map N code blocks to the time-frequency resources.

In defining the mapping method, exemplary embodiments of the present invention consider the modulation scheme being applied to the desired transmission data, thereby preventing the possible case where symbols of different code blocks constitute one modulation symbol. That is, in exemplary embodiments of the present invention, symbols constituting one modulation symbol become symbols in the same code block. The mapping operation can be equally realized with the interleaving operation.

A description will now be made of exemplary embodiments of the time-first-mapping method or interleaving method where a modulation scheme is considered.

First Exemplary Embodiment

A first exemplary embodiment provides a detailed mapping operation or interleaving operation to which the time-first-mapping method is applied considering a modulation scheme for N code blocks that underwent channel coding and rate matching.

Figure 5:
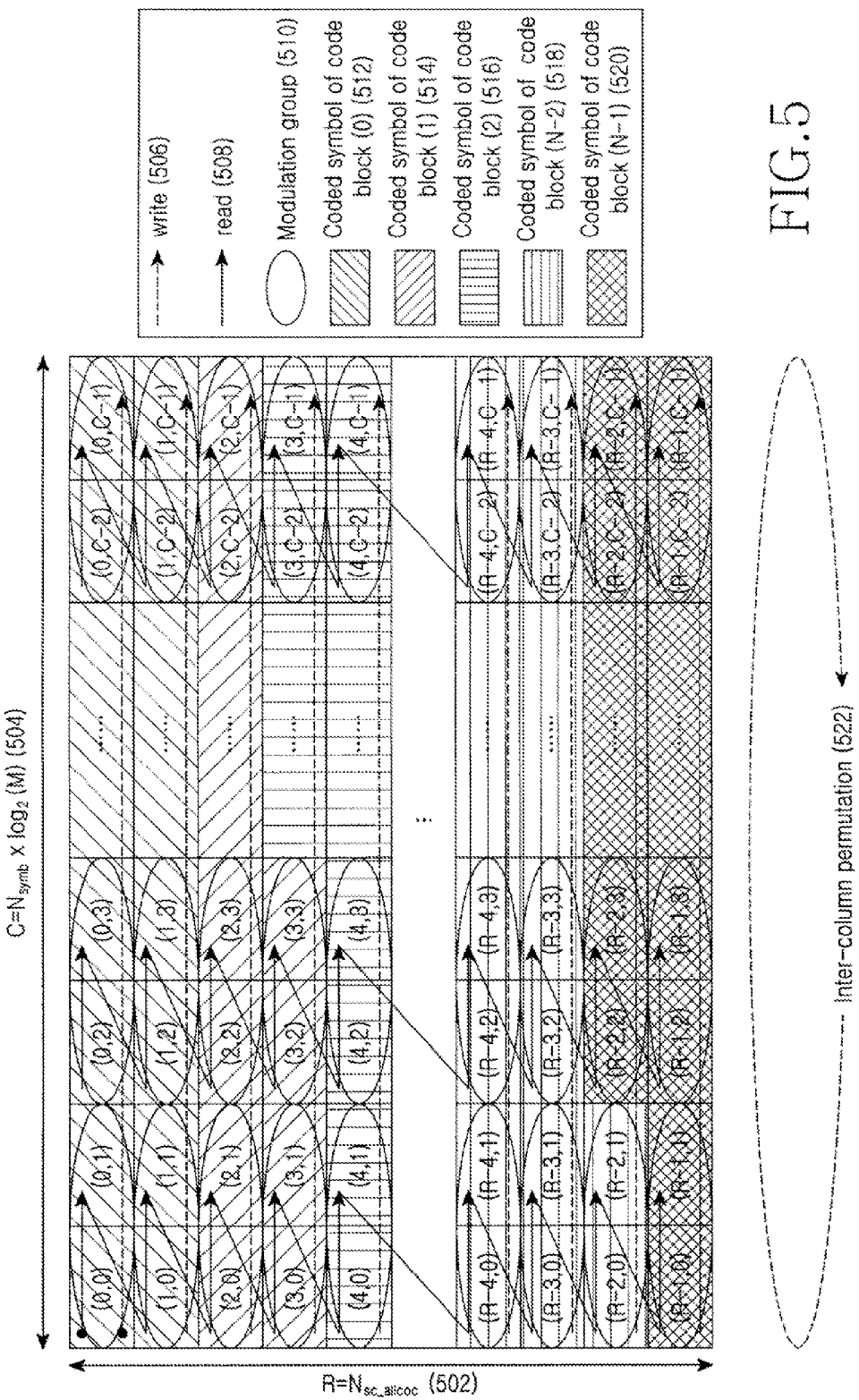
FIG. 5 is a diagram illustrating an operating principle of a first exemplary embodiment of the present invention.

FIG. 5 is a diagram illustrating an operating principle of a first exemplary embodiment of the present invention.

Referring to FIG. 5, first, a rectangular interleaver having an R×C size is defined. R 502, a size of a row in the interleaver, is determined by a size $N_{sc\_alloc}$ of frequency-domain resources allocated from an ENB (R=$N_{sc\_alloc}$). C 504, a size of a column in the interleaver, is determined by the number $N_{symb}$ of SC-FDMA symbols constituting one subframe and a modulation order M. That is, C=$N_{symb}$×$\log_2 M$. Regarding the modulation order M, M=4 for Quadrature Phase Shift Keying (QPSK), M=16 for 16-ary Quadrature Amplitude Modulation (16 QAM), and M=64 for 64 QAM, according to the modulation scheme. For N code blocks, a code block (0) 512 is composed of a total of K(0) channel-coded and rate-matched symbols #0 to #K(0)−1, a code block (1) 514 is composed of a total of K(1) channel-coded and rate-matched symbols #0 to #K(1)−1, a code block (2) 516 is composed of a total of K(2) channel-coded and rate-matched symbols #0 to #K(2)−1, a code block (N−2) 518 is composed of a total of K(N−2) channel-coded and rate-matched symbols #0 to #K(N−2)−1, and a code block (N−1) 520 is composed of a total of K(N−1) channel-coded and rate-matched symbols #0 to #K(N−1)−1.

The N code blocks are sequentially mapped in the R×C interleaver in such a manner that the horizontal area of the interleaver is preferentially filled by the time-first-mapping method. This is referred to as a row-by-row mapping scheme. If an intersection between an $r^{th}$ position of the vertical area and a $c^{th}$ position of the horizontal area in the interleaver is expressed as (r, c), the mapping operation starts from a position (0, 0). For example, the first exemplary embodiment maps the first symbol of the code block (0) 512 to the position (0, 0) of the interleaver, maps the second symbol to a position (0, 1) of the interleaver, and performs symbol mapping to the last position (0, C−1) of the horizontal area by repeating the operation. Thereafter, the next symbol is mapped to a position (1, 0), which is an intersection between a position increased by one in the vertical area of the interleaver and the first position of the horizontal area, and maps the last symbol to a position (1, C−1) of the interleaver by repeating the operation. The operation of disposing symbols of the code block in the interleaver is also referred to as a write operation 506. The first symbol of the code block (1) 514 is mapped to a position (2, 0) which is the next position of the position (1, C−1) where the last symbol of the code block (0) is disposed, maps the second symbol to a position (2, 1) of the interleaver, and maps the last symbol to a position (3, 3) by repeating the operation. By repeating the above process, the first symbol of the last code block (N−1) 520 is mapped to a position (R−2, 2) which is the next position of the position (R−2, 1) where the last symbol of the code block (N−2) is disposed, maps the second symbol to a position (R−2, 3) of the interleaver, and maps the last symbol to a position (R−1, C−1) by repeating the operation.

After the N code blocks are all disposed in the interleaver, inter-column permutation 522 (an operation of permuting columns of the interleaver) is performed, thereby ensuring robustness against a possible time-domain burst error.

When reading the code blocks that underwent inter-column permutation after being mapped in the interleaver, modulation groups 510 are generated by grouping adjacent columns in units of $\log_2 M$ taking the modulation scheme into account, and then column-by-column reading is performed for sequentially reading the modulation groups from the vertical area. The reading operation 508 starts from the position (0, 0) of the interleaver. The operation of reading symbols of code blocks from the interleaver is also referred to as a read operation.

FIG. 5 illustrates an example where a QPSK modulation scheme is applied, and in this example, adjacent columns constitute modulation groups in units of $\log_2 M=2$ from the QPSK modulation order M=4. The first modulation group read from the interleaver is composed of symbols disposed in the positions (0, 0) and (0, 1) of the interleaver, and the second modulation group is composed of symbols disposed in the positions (1, 0) and (1, 1), a vertical-area index that is increased by one from that of the first modulation group. Similarly, the last modulation group read from the interleaver is composed of symbols disposed in the positions (R−1, C−2) and (R−1, C−1).

Figure 6:
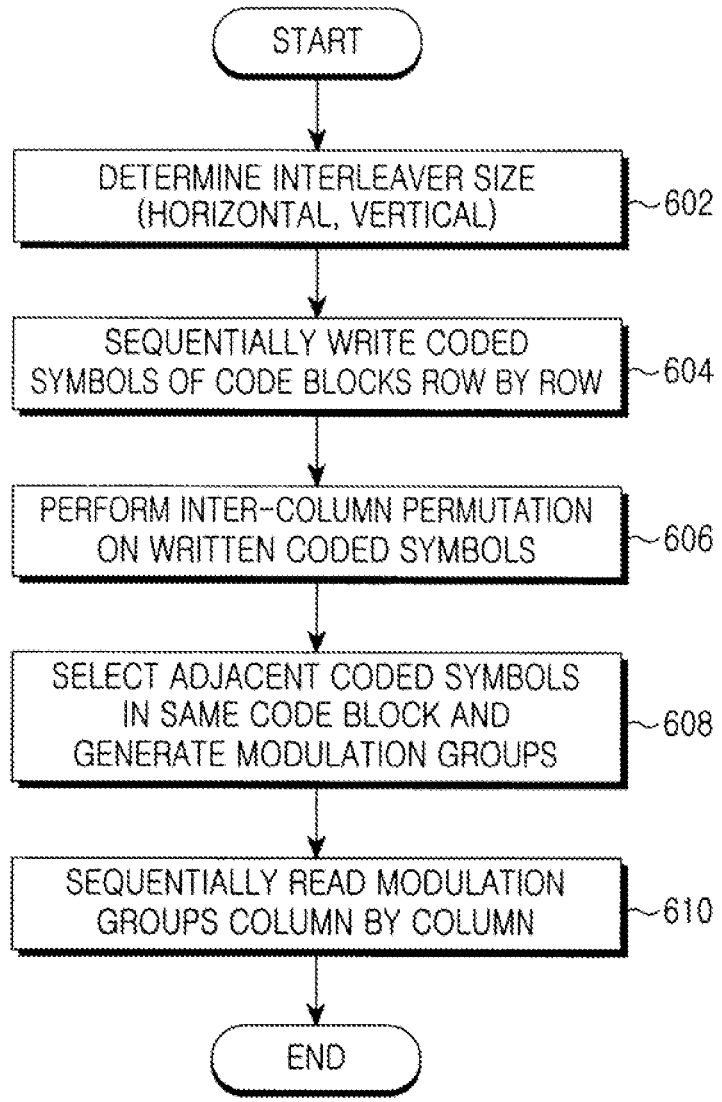
FIG. 6 is a diagram illustrating an interleaving procedure in a transmitter according to the first exemplary embodiment of the present invention.

FIG. 6 is a diagram illustrating an interleaving procedure in a transmitter according to the first exemplary embodiment of the present invention.

Referring to FIG. 6, the transmitter determines horizontal and vertical sizes of the interleaver in step 602. The transmitter determines the horizontal size as C=$N_{symb}$×$\log_2 M$ taking into account the number of SC-FDMA symbols constituting one subframe and a modulation scheme, and determines the vertical size R as a size $N_{sc\_alloc}$ of the frequency-domain resources allocated from an ENB. In step 604, the transmitter sequentially writes coded symbols in each of code blocks in the size-determined interleaver on a row-by-row basis. After completing the writing operation on all code blocks, the transmitter performs an inter-column permutation operation on the written coded symbols in step 606. The inter-column permutation operation is defined such that adjacent columns are spaced as far as possible from each other. However, the transmitter performs a single-column permutation operation on the columns constituting one modulation group, thereby preventing the possible case where symbols from different code blocks constitute one modulation symbol in the later step.

In step 608, the transmitter generates modulation groups by selecting $\log_2 M$ coded symbols that are adjacent to each other along the columns in the same code block in step 608, and sequentially reads the modulation groups on a column-by-column basis in step 610, thereby completing the interleaving operation.

Figure 7:
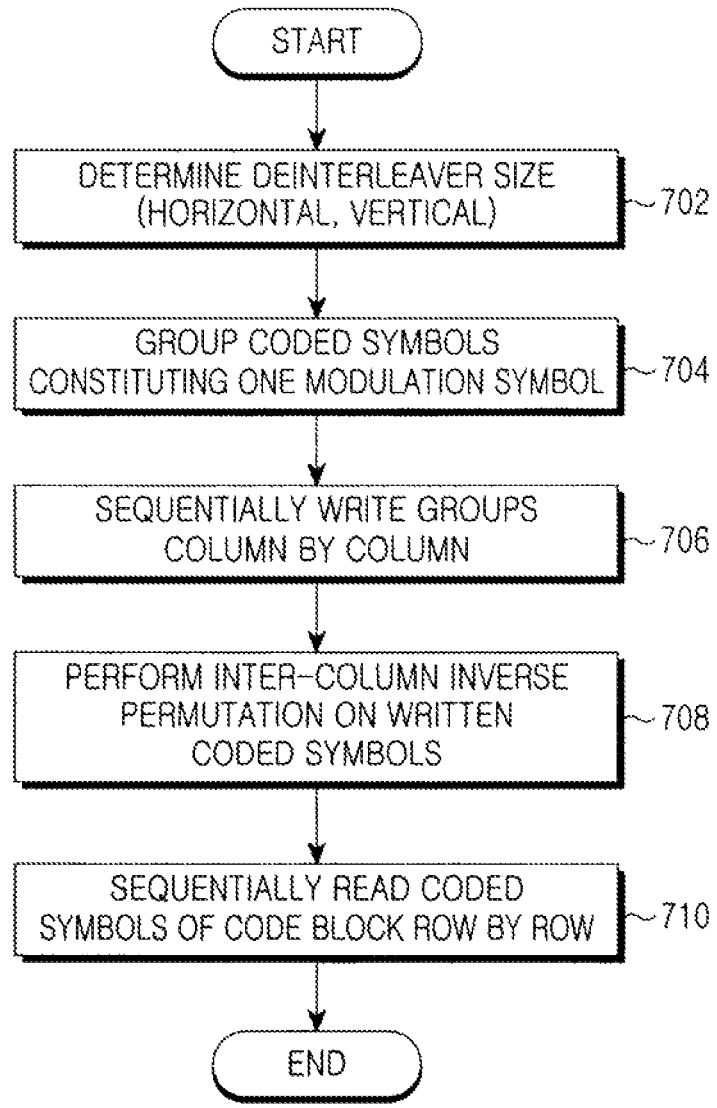
FIG. 7 is a diagram illustrating a deinterleaving procedure in a receiver according to the first exemplary embodiment of the present invention.

FIG. 7 is a diagram illustrating a deinterleaving procedure in a receiver according to the first exemplary embodiment of the present invention.

Referring to FIG. 7, the receiver determines horizontal and vertical sizes of a deinterleaver in step 702. The receiver determines the horizontal size as $C = N_{symb} \times \log_2 M$ taking into account the number of SC-FDMA symbols constituting one subframe and a modulation scheme, and determines the vertical size R as a size $N_{sc\_alloc}$ of the frequency-domain resources that an ENB allocates. In step 704, the receiver generates modulation groups by grouping $\log_2 M$ coded symbols constituting one modulation symbol on a row-by-row basis, for a received signal. In step 706, the receiver sequentially writes the modulation groups in the size-determined deinterleaver on a column-by-column basis. In step 708, the receiver performs on the written coded symbols an inter-column inverse permutation operation corresponding to an inverse operation of the inter-column permutation operation used in the interleaving procedure. Next, in step 710, the receiver sequentially reads the coded symbols on a row-by-row basis, thereby completing the deinterleaving operation.

Figure 8A:
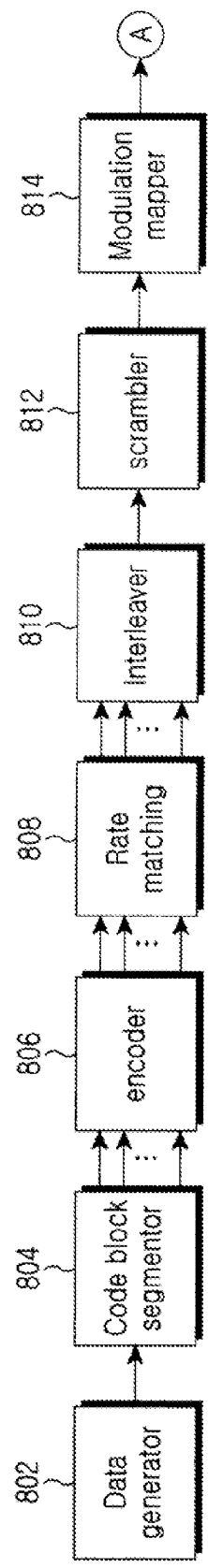
FIGS. 8A and 8B are diagrams illustrating a data transmission apparatus according to the first and a second exemplary embodiments of the present invention.
Figure 8B:
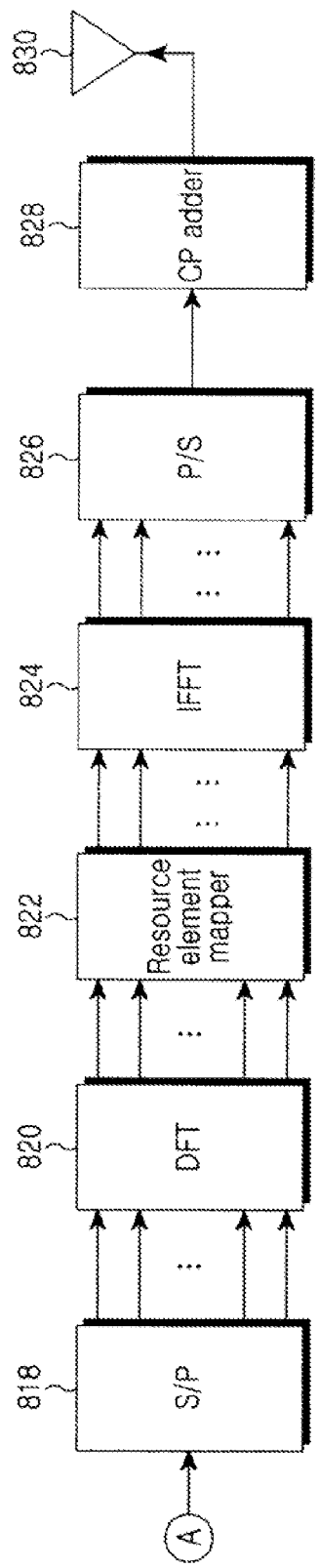

FIGS. 8A and 8B illustrate a data transmission apparatus to which the first and a second exemplary embodiments of the present invention are applied.

Referring to FIG. 8A, data generated by a data generator 802, when a size of the data information is greater than a defined number of bits, is segmented into a plurality of code blocks in a code block segmentor 804, and the code blocks are channel-coded by means of an encoder 806. The channel-coded code blocks are size-adjusted to be suitable to a size of the allocated time-frequency resources in a rate matching block 808, and then input to an interleaver 810. The interleaver 810, as described above, sequentially writes the input code blocks on a row-by-row basis by the time-first-mapping scheme, performs an inter-column permutation operation thereon, and then sequentially reads modulation groups formed in the same code block on a column-by-column basis. A scrambler 812 performs a permutation operation on the signal received from the interleaver 810 in units of modulation groups, for inter-user randomization, and a modulation mapper 814 performs a modulation operation on the input signal. The modulated signal is converted into a parallel signal in a Serial-to-Parallel (S/P) converter 818 of FIG. 8B, that outputs the parallel signal to a DFT block 820. The DFT block 820 reads the input data in units of SC-FDMA symbols, and outputs it as a frequency-domain signal through DFT signal processing. A resource element mapper 822 maps the signal received from the DFT block 820 to the frequency-domain resources allocated from an ENB in the entire system transmission band. An output signal of the resource element mapper 822 is transformed into a time-domain signal in an IFFT block 824 through IFFT signal processing, and is then converted into a serial signal by means of a P/S converter 826. A CP adder 828 adds a CP for inter-symbol interference prevention to the serial signal, and then transmits the CP-added data via a transmit antenna 830.

Figure 9:
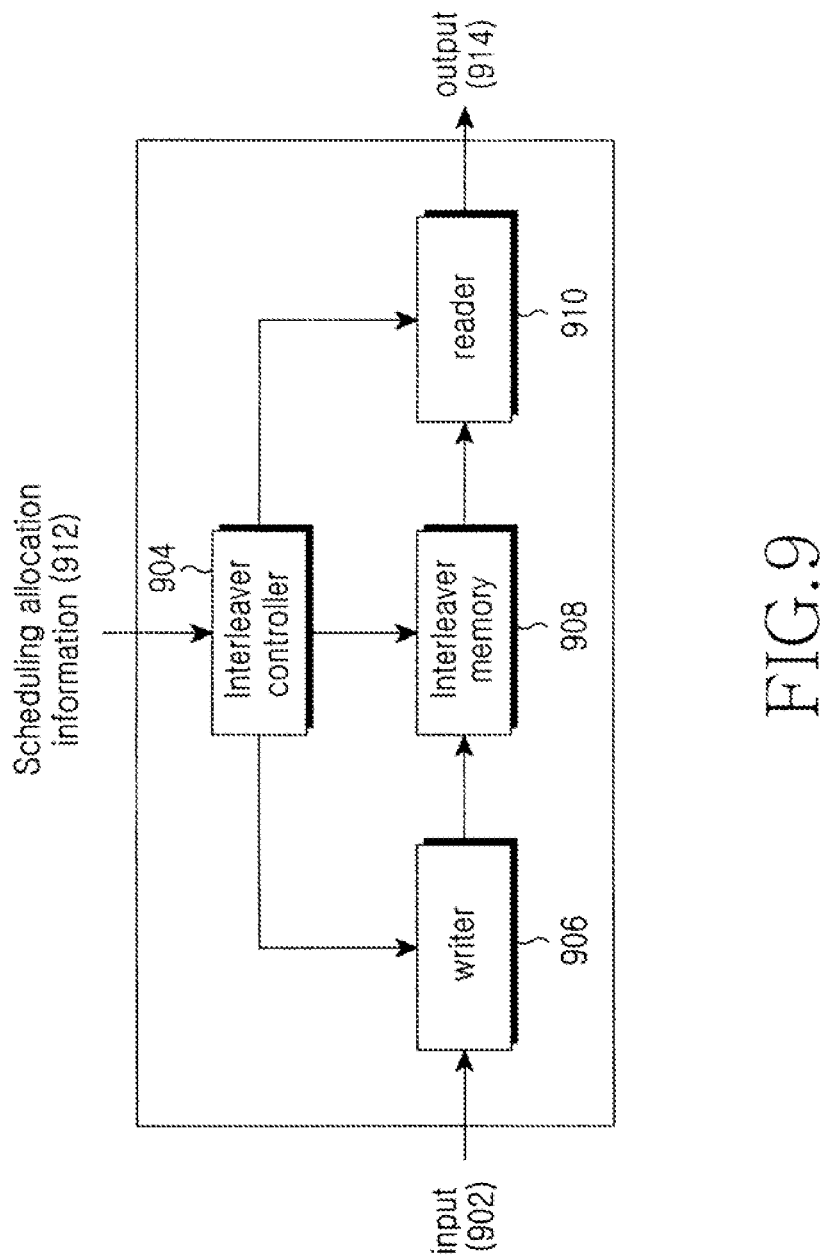
FIG. 9 is a diagram illustrating an internal structure of the interleaver according to the first and second exemplary embodiments of the present invention.

FIG. 9 is a diagram illustrating an internal structure of the interleaver, according to the first and second exemplary embodiments of the present invention.

Referring to FIG. 9, the interleaver includes an interleaver controller 904, a writer 906, an interleaver memory 908, and a reader 910. The interleaver controller 904 acquires a size of time-frequency resources for data transmission and a modulation scheme from scheduling allocation information 912, and determines a size of the interleaver memory 908 depending on the acquired information. The writer 906 sequentially writes a signal stream 902 being input to the interleaver in the interleaver memory 908 on a row-by-row basis by the time-first-mapping scheme. The reader 910 performs inter-column permutation on the signal stream written in the interleaver memory 908, sequentially reads generated modulation groups on a column-by-column basis and provides an output 914. The interleaver controller 904 provides the writer 906 with information such as size and writing order of each code block, and a size of the interleaver memory 908, to control an operation of the writer 906, and provides the reader 910 with information such as a definition of an inter-column permutation operation, a modulation group generation method, a size of the interleaver memory 908, and reading order, to control an operation of the reader 910.

Figure 10A:
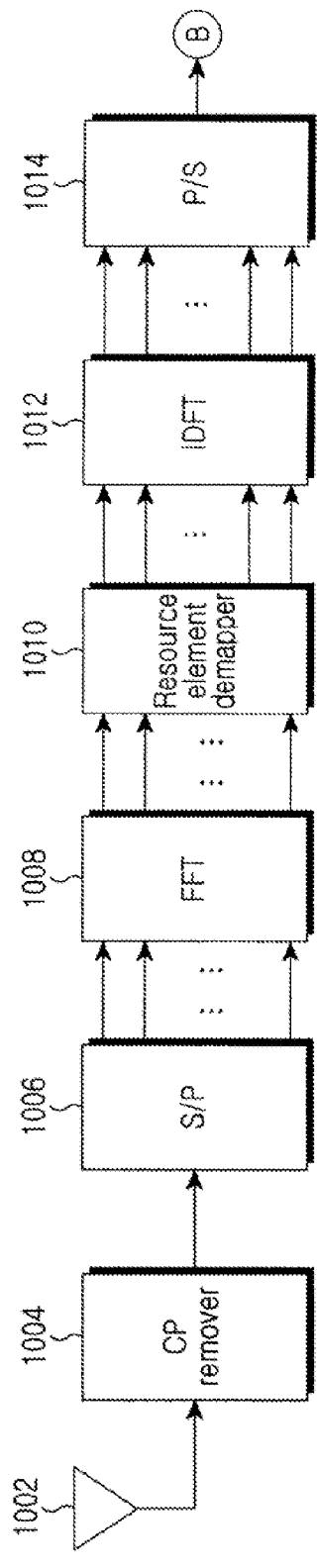
FIGS. 10A and 10B are diagrams illustrating a data reception apparatus according to the first and second exemplary embodiments of the present invention.
Figure 10B:
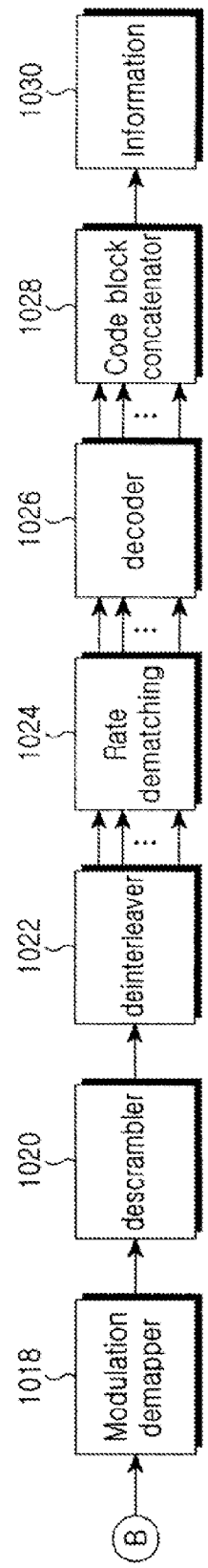

FIGS. 10A and 10B illustrate a data reception apparatus to which the first and second exemplary embodiments of the present invention are applied.

Referring to FIG. 10A, a signal received via an antenna 1002 is subject to CP removal by means of a CP remover 1004, and the CP-removed signal is converted into a parallel signal by an S/P converter 1006, and then input to a Fast Fourier Transform (FFT) block 1008. The FFT block 1008 transforms the input signal into a frequency-domain signal by FFT transforming. A resource element demapper 1010 extracts a frequency-domain signal to which desired data is mapped, from the frequency-domain signal, and applies the extracted signal to an Inverse Discrete Fourier Transform (IDFT) block 1012. The signal input to the IDFT block 1012 is transformed into a time-domain signal by IDFT signal processing, and then converted into a serial signal by means of a P/S converter 1014. The serial signal is demodulated by a modulation demapper 1018 of FIG. 10B, and a descrambler 1020 performs descrambling on the demodulated signal using an inverse operation of the scrambling operation used in a transmitter, and then outputs the descrambled signal to a deinterleaver 1022. A detailed structure of an exemplary deinterleaver 1022 is illustrated in FIG. 9. The deinterleaver 1022, as described above, generates modulation groups on a row-by-row basis using the input signal stream according to a modulation scheme of the transmitter, and then sequentially writes the modulation groups column by column. Thereafter, the deinterleaver 1022 performs an inter-column inverse permutation operation thereon and sequentially reads coded symbols row by row. The output signal is input to a rate dematching block 1024 for each code block, in which its size is adjusted to the original code block size. The rate-dematched signal is decoded by a decoder 1026, and then concatenated to one data stream by a code block concatenator 1028, thereby achieving data acquisition of the information 1030.

Meanwhile, it is also possible to obtain a similar effect as that of the foregoing operation by defining an interleaver given by rotating, by 90°, the R×C rectangular interleaver and deinterleaver defined in the first exemplary embodiment. In this case, a horizontal size of the interleaver and deinterleaver is determined as a size $N_{sc\_alloc}$ of the frequency-domain resources allocated from the ENB, and a vertical size is determined as $N_{symb} \times \log_2 M$ from the number $N_{symb}$ of SC-FDMA symbols constituting one subframe and a modulation order M. Therefore, the foregoing operations such as row-by-row writing, a modulation group generation method, an inter-column permutation operation, and column-by-column reading, should be changed according to a definition of horizontal/vertical axes of the newly defined interleaver and deinterleaver.

Second Exemplary Embodiment

A second exemplary embodiment provides another detailed mapping operation or interleaving operation to which the time-first-mapping method is applied considering a modulation scheme for N code blocks that underwent channel coding and rate matching.

Figure 11:
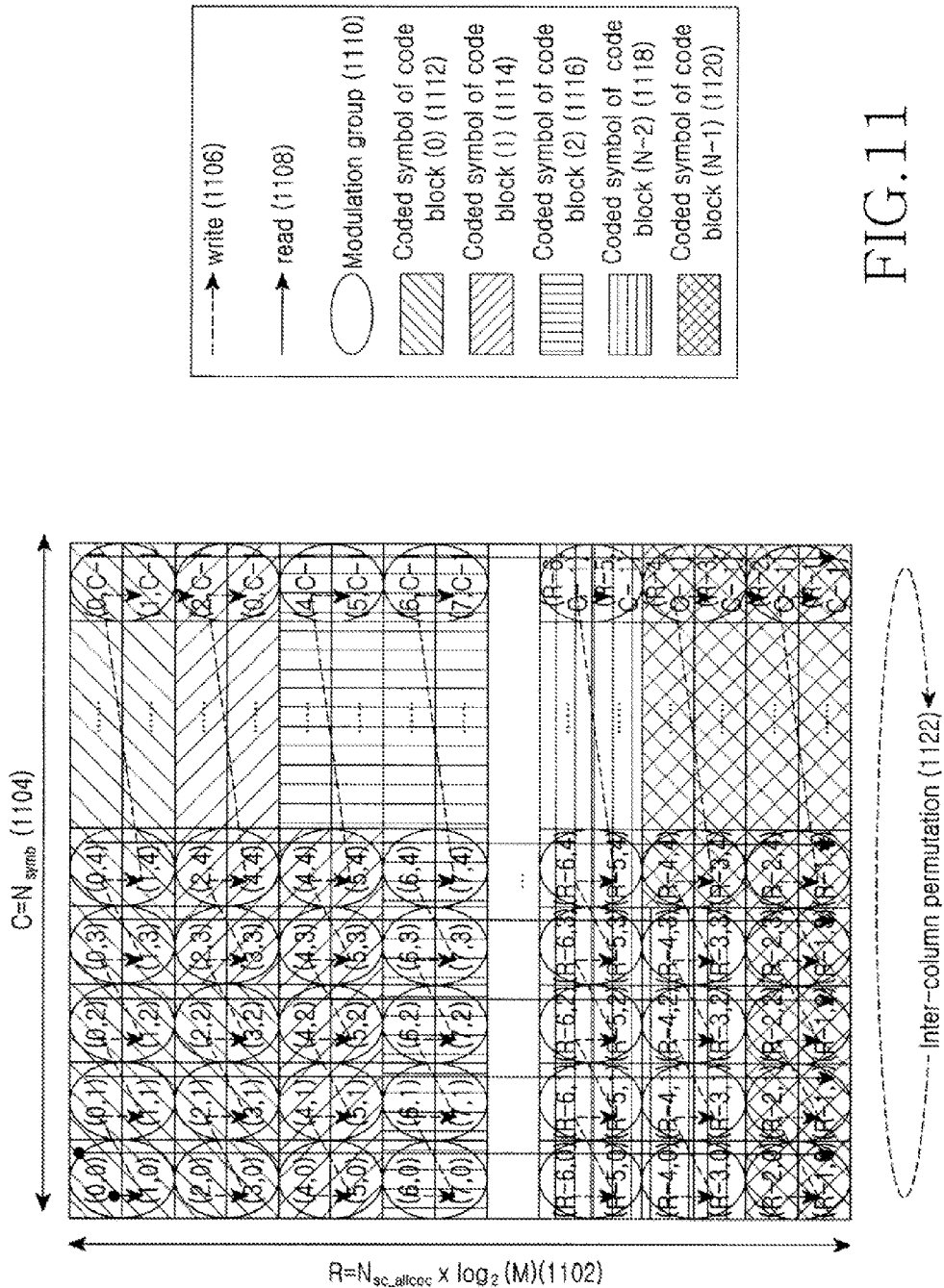
FIG. 11 is a diagram illustrating an operating principle of the second exemplary embodiment of the present invention.

With reference to FIG. 11, a detailed operation of the second exemplary embodiment will be described below.

First, a rectangular interleaver having an R×C size is defined. R 1102, a size of a row in the interleaver, is determined by a size $N_{sc\_alloc}$ of frequency-domain resources allocated from an ENB and a modulation order M. That is, $R=N_{sc\_alloc} \times \log_2 M$. Regarding the modulation order M, M=4 for QPSK, M=16 for 16 QAM, and M=64 for 64 QAM, according to the modulation scheme. C 1104, a size of a column in the interleaver, is determined by the number $N_{symb}$ of SC-FDMA symbols constituting one subframe. For N code blocks, a code block (0) 1112 is composed of a total of K(0) channel-coded and rate-matched symbols #0 to #K(0)−1, a code block (1) 1114 is composed of a total of K(1) channel-coded and rate-matched symbols #0 to #K(1)−1, a code block (2) 1116 is composed of a total of K(2) channel-coded and rate-matched symbols #0 to #K(2)−1, a code block (N−2) 1118 is composed of a total of K(N−2) channel-coded and rate-matched symbols #0 to #K(N−2)−1, and a code block (N−1) 1120 is composed of a total of K(N−1) channel-coded and rate-matched symbols #0 to #K(N−1)−1.

In the second exemplary embodiment, modulation groups 1110 are generated in the vertical direction so that adjacent rows constitute one modulation symbol by grouping symbols in each code block in units of $\log_2 M$ taking the modulation scheme into account, and then row-by-row mapping is performed for sequentially mapping the modulation groups in a horizontal area. The reading operation 1108 starts from the position (0, 0) of the interleaver and the mapping operation starts from a position (0, 0) of the interleaver.

FIG. 11 illustrates an example where a QPSK modulation scheme is applied, and in this example, adjacent rows constitute modulation groups in units of $\log_2 M=2$ from the QPSK modulation order M=4. The first modulation group being mapped in the R×C interleaver is disposed in positions (0, 0) and (1, 0) of the interleaver, and the second modulation group is disposed in positions (0, 1) and (1, 1), a horizontal-area index of which is increased by one from that of the first modulation group. Similarly, the last modulation group being mapped in the interleaver is disposed in positions (R−2, C−1) and (R−1, C−1). The operation of disposing is also referred to as a write operation 1106.

After the N code blocks are all disposed in the interleaver, inter-column permutation 1122 (an operation of permuting columns of the interleaver) is performed, ensuring robustness against a possible time-domain burst error.

When reading the code blocks that underwent inter-column permutation after being mapped in the interleaver, column-by-column sequential reading is performed. The reading operation starts from the position (0, 0) of the interleaver. The first symbol being read from the interleaver is a symbol disposed in the position (0, 0) of the interleaver, the second symbol being read from the interleaver is a symbol disposed in the position (1, 0), and the third symbol being read from the interleaver is a symbol disposed in the position (2, 0). In this manner, the last symbol being read from the interleaver is a symbol disposed in the position (R−1, C−1).

Figure 12:
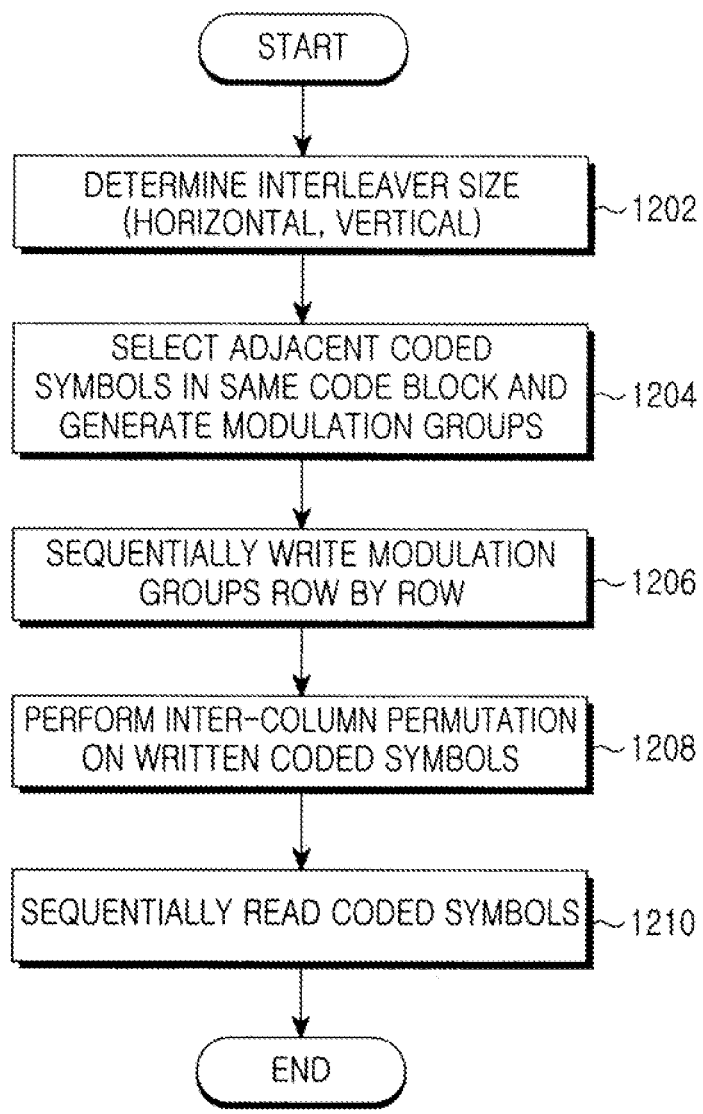
FIG. 12 is a diagram illustrating an interleaving procedure in a transmitter according to the second exemplary embodiment of the present invention.

FIG. 12 is a diagram illustrating an interleaving procedure in a transmitter according to the second exemplary embodiment of the present invention.

Referring to FIG. 12, the transmitter determines horizontal and vertical sizes of an interleaver in step 1202. The transmitter determines the horizontal size as $C=N_{symb}$ taking into account the number of SC-FDMA symbols constituting one subframe, and determines the vertical size R as $R=N_{sc\_alloc} \times \log_2 M$ from the size $N_{sc\_alloc}$ of the frequency-domain resources allocated from an ENB, and a modulation order M. In step 1204, the transmitter selects $\log_2 M$ adjacent coded symbols in the same code block and generates modulation groups in the vertical direction so that adjacent rows constitute one modulation symbol. In step 1206, the transmitter sequentially writes the modulation groups in the horizontal area on a row-by-row basis. After completing the writing operation on all code blocks, the transmitter performs an inter-column permutation operation on the written coded symbols in step 1208. The inter-column permutation operation is defined such that adjacent columns are spaced as far as possible from each other. In step 1210, the transmitter sequentially reads the symbols mapped in the interleaver on a column-by-column basis, thereby completing the interleaving operation.

Figure 13:
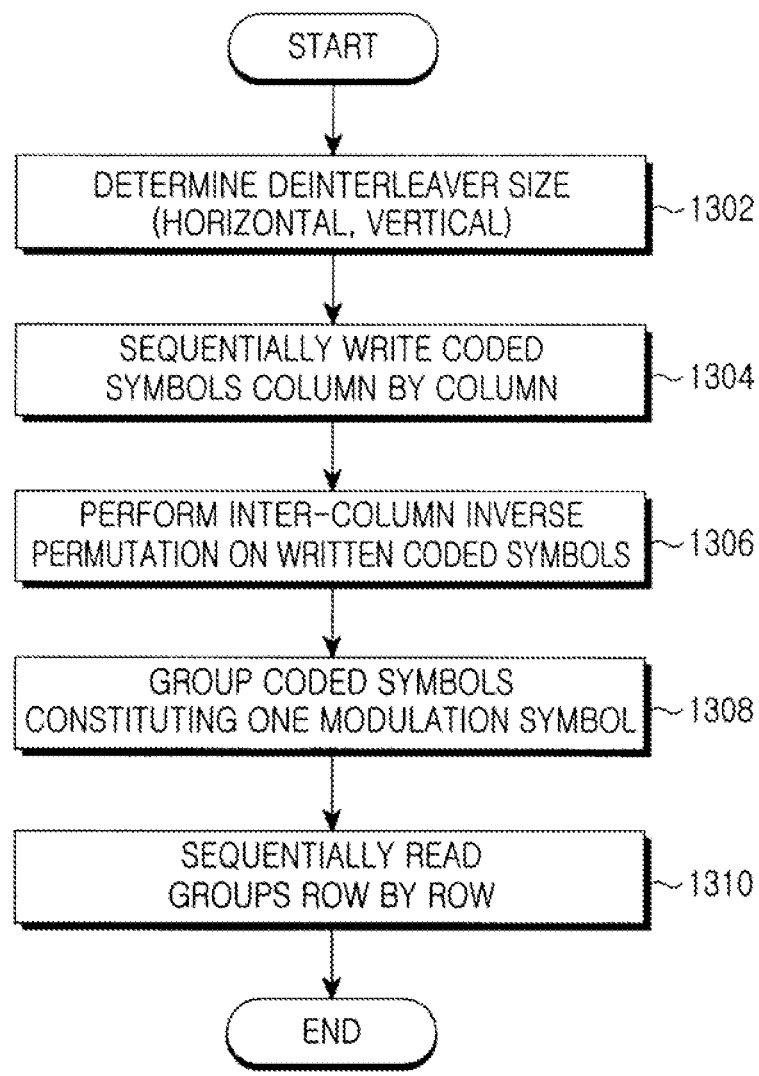
FIG. 13 is a diagram illustrating a deinterleaving procedure in a receiver according to the second exemplary embodiment of the present invention.

FIG. 13 is a diagram illustrating a deinterleaving procedure in a receiver according to the second exemplary embodiment of the present invention.

Referring to FIG. 13, the receiver determines horizontal and vertical sizes of a deinterleaver in step 1302. The receiver determines the horizontal size as $C=N_{symb}$ taking into account the number of SC-FDMA symbols constituting one subframe, and determines the vertical size R as $R=N_{sc\_alloc} \times \log_2 M$ from the size $N_{sc\_alloc}$ of the frequency-domain resources allocated from an ENB, and a modulation order M. In step 1304, the receiver sequentially writes input symbols in the deinterleaver on a column-by-column basis. In step 1306, the receiver performs on the written coded symbols an inter-column inverse permutation operation corresponding to an inverse operation of the inter-column permutation operation performed in the interleaving procedure. Next, in step 1308, the receiver generates modulation groups by grouping $\log_2 M$ symbols in adjacent rows taking the modulation scheme into account. In step 1310, the receiver sequentially reads the modulation groups row by row, thereby completing the deinterleaving operation.

Since a data transmission apparatus, an interleaver's internal apparatus, and a data reception apparatus, to which the second exemplary embodiment is applied, are similar to those in the first exemplary embodiment, a description thereof will be omitted for conciseness. However, the detailed interleaving/deinterleaving operation thereof follows the description of the second exemplary embodiment.

It is also possible to obtain a similar effect as that of the foregoing operation by defining an interleaver given by rotating, by 90°, the R×C rectangular interleaver and deinterleaver defined in the second exemplary embodiment. In this case, a horizontal size of the interleaver and deinterleaver is determined as $N_{sc\_alloc} \times \log_2 M$ from the size $N_{sc\_alloc}$ of the frequency-domain resources allocated from the ENB and the modulation order M, and the vertical size is determined as the number $N_{symb}$ of SC-FDMA symbols constituting one subframe. Therefore, the foregoing operations such as row-by-row writing, a modulation group generation method, an inter-column permutation operation, and column-by-column reading, should be changed according to a definition of horizontal/vertical axes of the newly defined interleaver and deinterleaver.

Third Exemplary Embodiment

A third exemplary embodiment provides a detailed mapping operation or interleaving operation to which the time-first-mapping method is applied for N modulated code blocks.

While the first exemplary embodiment and second exemplary embodiment provide an operation to which the time-first-mapping method is applied for N channel-coded and rate-matched code blocks taking the modulation scheme into account, the third exemplary embodiment provides an operation to which the time-first-mapping method is applied for N code blocks that underwent modulation after channel coding and rate matching.

Figure 14:
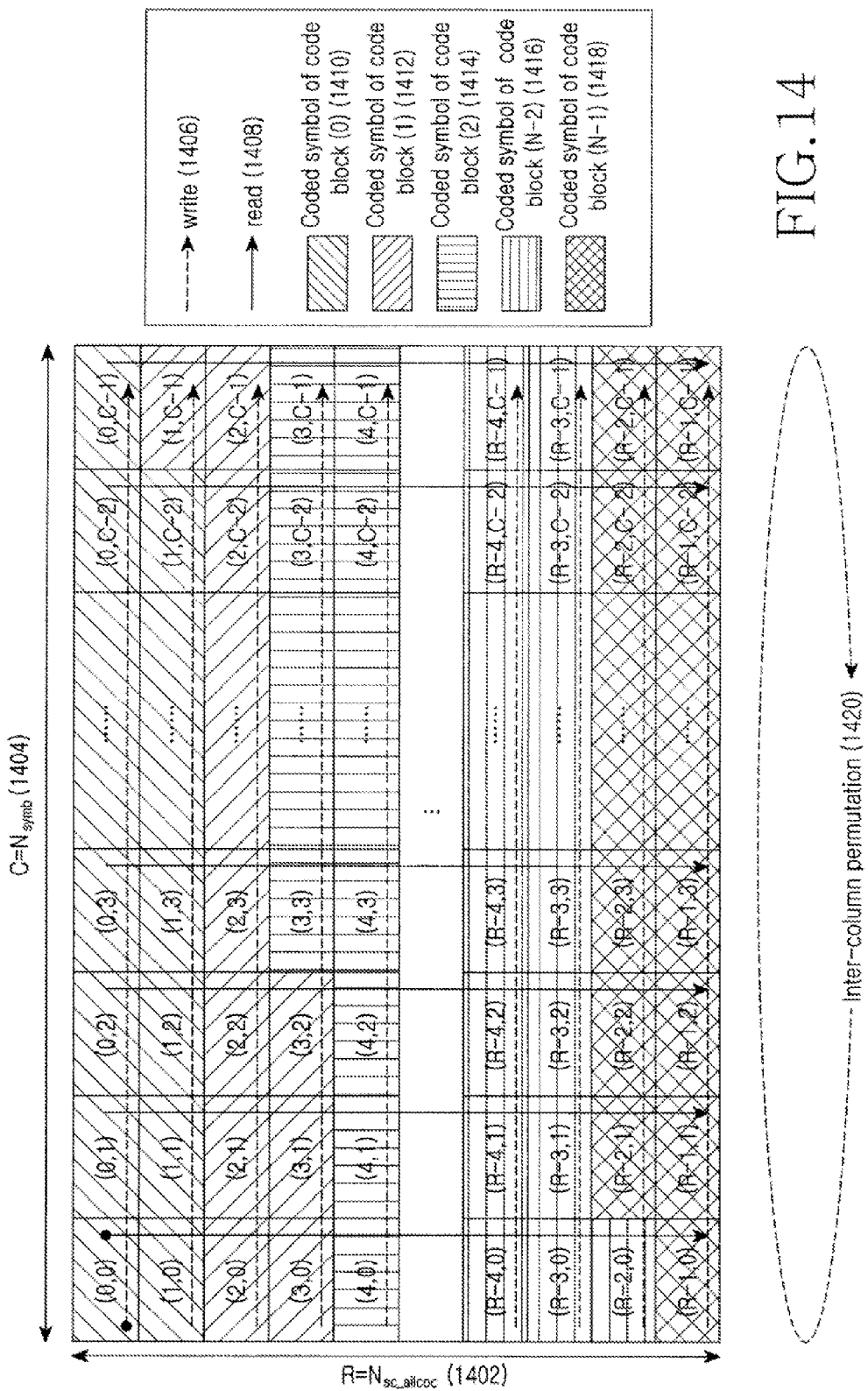
FIG. 14 is a diagram illustrating an operating principle of a third exemplary embodiment of the present invention.

With reference to FIG. 14, a detailed operation of the third exemplary embodiment will be described below.

Referring to FIG. 14, first, a rectangular interleaver having an R×C size is defined. R 1402, a size of a row in the interleaver, is determined by the size $N_{sc\_alloc}$ of the frequency-domain resources allocated from an ENB. C 1404, a size of a column in the interleaver, is determined by the number $N_{symb}$ of SC-FDMA symbols constituting one subframe. For N code blocks, a code block (0) 1410 is composed of a total of K(0) channel-coded/rate-matched/modulated symbols #0 to #K(0)−1, a code block (1) 1412 is composed of a total of K(1) channel-coded/rate-matched/modulated symbols #0 to #K(1)−1, a code block (2) 1414 is composed of a total of K(2) channel-coded/rate-matched/modulated symbols #0 to #K(2)−1, a code block (N−2) 1416 is composed of a total of K(N−2) channel-coded/rate-matched/modulated symbols #0 to #K(N−2)−1, a code block (N−1) 1418 is composed of a total of K(N−1) channel-coded/rate-matched/modulated symbols #0 to #K(N−1)−1.

Row-by-row mapping is performed for sequentially mapping symbols in each code block in a horizontal area of the interleaver. The mapping operation starts from a position (0, 0) of the interleaver. The first symbol being mapped in the R×C interleaver is disposed in the position (0, 0) of the interleaver, and the second symbol is disposed in the position (0, 1), a horizontal-area index of which is increased by one from that of the first symbol. Similarly, the last symbol being mapped in the interleaver is disposed in the position (R−1, C−1). The operation of disposing is also referred to as a write operation 1406.

After the N code blocks are disposed in the interleaver, inter-column permutation 1420 (an operation of permuting columns of the interleaver) is performed, thereby ensuring robustness against a possible time-domain burst error.

When reading the code blocks that underwent inter-column permutation after being mapped in the interleaver, column-by-column sequential reading is performed. The reading operation 1408 starts from the position (0, 0) of the interleaver. The first symbol being read from the interleaver is a symbol disposed in the position (0, 0) of the interleaver, the second symbol being read from the interleaver is a symbol disposed in the position (1, 0), the third symbol being read from the interleaver is a symbol disposed in the position (2, 0), and in this manner, the last symbol being read from the interleaver is a symbol disposed in the position (R−1, C−1).

Figure 15:
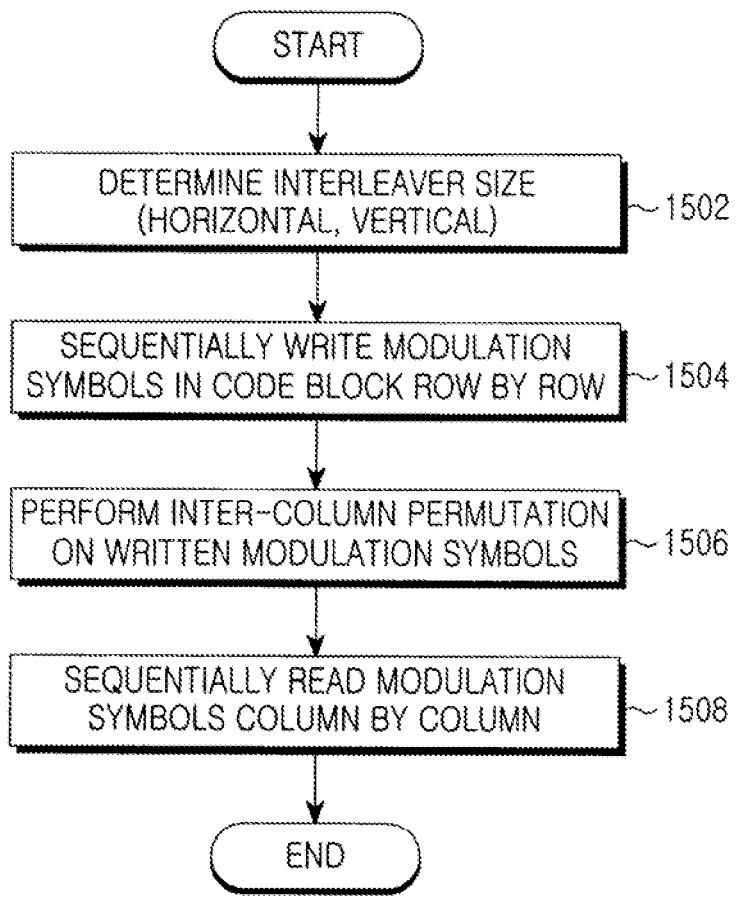
FIG. 15 is a diagram illustrating an interleaving procedure in a transmitter according to the third exemplary embodiment of the present invention.

FIG. 15 is a diagram illustrating an interleaving procedure in a transmitter according to the third exemplary embodiment of the present invention.

Referring to FIG. 15, the transmitter determines horizontal and vertical sizes of an interleaver in step 1502. The transmitter determines the horizontal size as $C=N_{symb}$ taking into account the number of SC-FDMA symbols constituting one subframe, and determines the vertical size R as the size $N_{sc\_alloc}$ of the frequency-domain resources allocated from an ENB. In step 1504, the transmitter sequentially writes symbols in code blocks in the horizontal area on a row-by-row basis. After completing the writing operation on all the code blocks, the transmitter performs an inter-column permutation operation on the written symbols in step 1506. The inter-column permutation operation is defined such that adjacent columns are spaced as far as possible from each other. In step 1508, the transmitter sequentially reads the symbols mapped in the interleaver on a column-by-column basis, thereby completing the interleaving operation.

Figure 16:
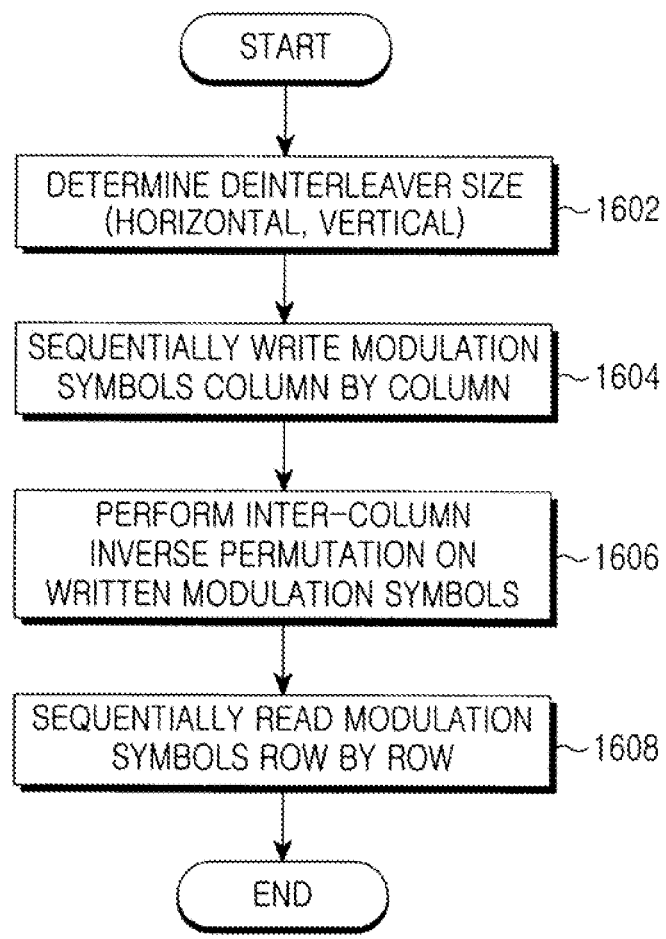
FIG. 16 is a diagram illustrating a deinterleaving procedure in a receiver according to the third exemplary embodiment of the present invention.

FIG. 16 is a diagram illustrating a deinterleaving procedure in a receiver according to the third exemplary embodiment of the present invention.

Referring to FIG. 16, the receiver determines horizontal and vertical sizes of a deinterleaver in step 1602. The receiver determines the horizontal size as $C=N_{symb}$ taking into account the number of SC-FDMA symbols constituting one subframe, and determines the vertical size R as the size $N_{sc\_alloc}$ of the frequency-domain resources allocated from an ENB. In step 1604, the receiver sequentially writes input modulation symbols in the deinterleaver on a column-by-column basis. In step 1606, the receiver performs on the written coded symbols an inter-column inverse permutation operation corresponding to an inverse operation of the inter-column permutation operation performed in the interleaving procedure. Next, in step 1608, the receiver sequentially reads symbols in the deinterleaver on a row-by-row basis, thereby completing the deinterleaving operation.

Figure 17A:
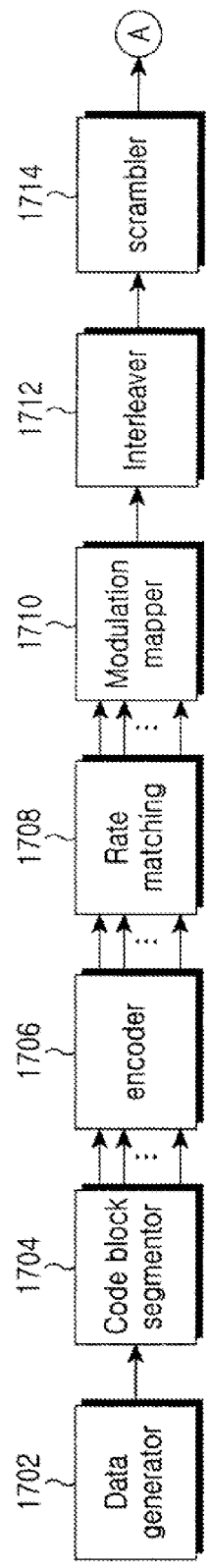
FIGS. 17A and 17B are diagrams illustrating a data transmission apparatus according to the third exemplary embodiment of the present invention.
Figure 17B:
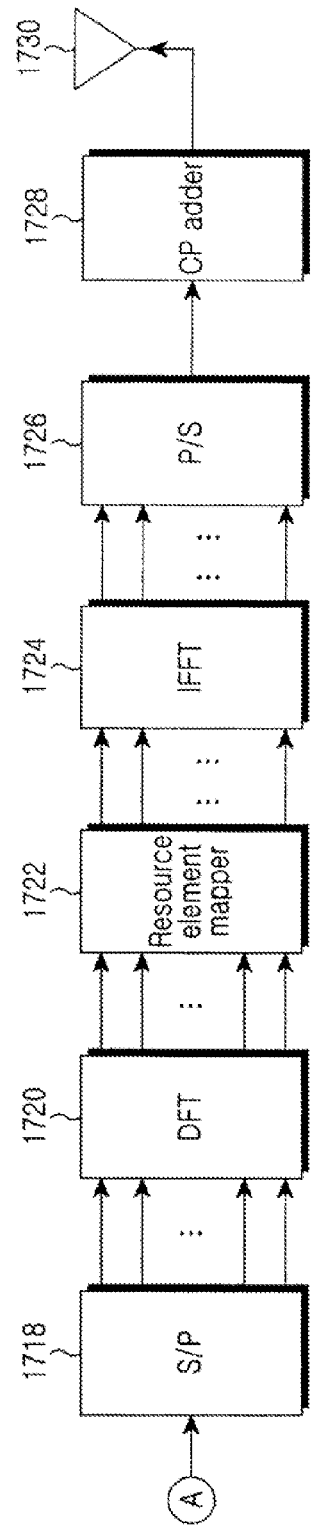

FIGS. 17A and 17B illustrate a data transmission apparatus to which the third exemplary embodiment of the present invention is applied.

Referring to FIG. 17A, data generated by a data generator 1702, when a size of the data information is greater than a defined number of bits, is segmented into a plurality of code blocks in a code block segmentor 1704, and the code blocks are channel-coded by means of an encoder 1706. The channel-coded code blocks are size-adjusted to be suitable to a size of the allocated time-frequency resources in a rate matching block 1708, and a modulation mapper 1710 performs a modulation operation on the code blocks and outputs the results to an interleaver 1712. The interleaver 1712, as described above, sequentially writes the input code blocks on a row-by-row basis by the time-first-mapping scheme, performs an inter-column permutation operation thereon, and then sequentially reads them on a column-by-column basis. A scrambler 1714 performs a permutation operation on the signal received from the interleaver 1712, for inter-user randomization. The scrambled signal is converted into a parallel signal in an S/P converter 1718 of FIG. 17B, and then the parallel signal is output to a DFT block 1720. The DFT block 1720 reads input data in units of SC-FDMA symbols, and outputs a frequency-domain signal through DFT signal processing. A resource element mapper 1722 maps the signal received from the DFT block 1720 to the frequency-domain resources allocated from an ENB in the entire system transmission band. An output signal of the resource element mapper 1722 is transformed into a time-domain signal in an IFFT block 1724 through IFFT signal processing, and then converted into a serial signal by means of a P/S converter 1726. A CP adder 1728 adds a CP for inter-symbol interference prevention to the serial signal, and then transmits the CP-added data via a transmit antenna 1730.

An internal structure of the interleaver 1712 follows the description of FIG. 9. However, in the third exemplary embodiment, there is no need to consider the modulation scheme in the interleaver.

Figure 18A:
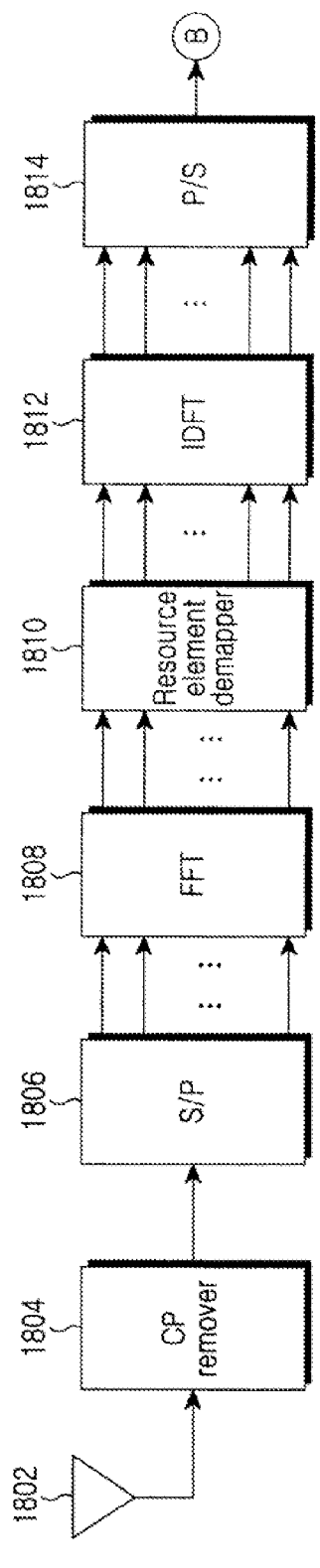
FIGS. 18A and 18B are diagrams illustrating a data reception apparatus according to the third exemplary embodiment of the present invention.
Figure 18B:
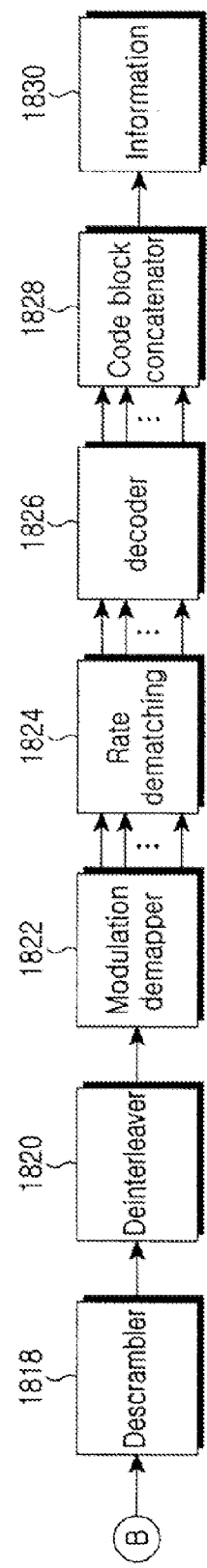

FIGS. 18A and 18B illustrate a data reception apparatus to which the third exemplary embodiment of the present invention is applied.

Referring to FIG. 18A, a signal received via an antenna 1802 is subject to CP removal by means of a CP remover 1804, and the CP-removed signal is converted into a parallel signal by an S/P converter 1806, and then input to an FFT block 1808. The FFT block 1808 transforms the input signal into a frequency-domain signal by FFT transforming A resource element demapper 1810 extracts a frequency-domain signal to which desired data is mapped, from the frequency-domain signal, and applies the extracted signal to an IDFT block 1812. The signal input to the IDFT block 1812 is transformed into a time-domain signal by IDFT signal processing, and then converted into a serial signal by means of a P/S converter 1814. As for the serial signal, a descrambler 1818 of FIG. 18B performs on the serial signal an inverse operation of the scrambling operation used in a transmitter, and then inputs the descrambled signal to a deinterleaver 1820. The deinterleaver 1820, as described above, sequentially writes the input signal stream on a column-by-column basis, and then sequentially reads the symbols on a row-by-row basis after performing an inter-column inverse permutation operation. A modulation demapper 1822 demodulates the signal received from the deinterleaver 1820, and outputs the results to a rate dematching block 1824 for each code block, in which the size is adjusted to the original code block size. The rate-dematched signal is decoded by a decoder 1826, and then concatenated to one data stream by a code block concatenator 1828, thereby achieving data acquisition of the information 1830.

Meanwhile, it is also possible to obtain a similar effect as that of the foregoing operation by defining an interleaver given by rotating, by 90°, the R×C rectangular interleaver and deinterleaver defined in the second embodiment. In this case, a horizontal size of the interleaver and deinterleaver is determined as the size $N_{sc\_alloc}$ of the frequency-domain resource allocated from the ENB, and the vertical size is determined as the number $N_{symb}$ of SC-FDMA symbols constituting one subframe. Therefore, the foregoing operations such as row-by-row writing, an inter-column permutation operation, and column-by-column reading, should be changed according to a definition of horizontal/vertical axes of the newly defined interleaver and deinterleaver.

As is apparent from the foregoing description, exemplary embodiments of the present invention define a detailed interleaving operation for desired transmission data in a mobile communication system, thereby reducing a bit error rate or block error rate for the data and increasing reception reliability.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An interleaving method in a mobile communication system, the method comprising:
    encoding a plurality of bits to output encoded bits;
    interleaving the encoded bits in a unit of at least one set of rows determined based on a modulation scheme;
    scrambling the interleaved encoded bits with a scrambling code to generate scrambled bits; and
    modulating the scrambled bits based on the modulation scheme to output at least one symbol.

2. The method of claim 1, wherein a size of set of rows is defined based on $Log_2 M$, where M denotes an integer value defined according to the modulation scheme.

3. The method of claim 1, wherein one set of rows is one group of consecutive bits determined based on a modulation scheme,
    wherein the one group of consecutive bits is equal to one symbol, and
    wherein the number of the groups is equal to the number of symbols for data transmission in one subframe.

4. A deinterleaving method in a mobile communication system, the method comprising:
    demodulating received symbols to output scrambled bits based on a modulation scheme;
    descrambling the scrambled bits according to a scrambling code to output interleaved encoded bits;
    deinterleaving the interleaved encoded bits in a unit of at least one set of rows determined based on the modulation scheme; and
    decoding the encoded bits to output a plurality of bits.

5. The method of claim 4, wherein a size of each set of rows is defined based on $Log_2 M$, where M denotes an integer value defined according to the modulation scheme.

6. The method of claim 4, wherein one set of rows is one group of consecutive bits determined based on a modulation scheme,
    wherein the one group of consecutive bits is equal to one symbol, and
    wherein the number of the groups is equal to the number of symbols for data transmission in one subframe.

7. An interleaving apparatus in a mobile communication system, the apparatus comprising:
    an encoder encoding a plurality of bits to output encoded bits;
    an interleaver interleaving the encoded bits in a unit of at least one set of rows determined based on a modulation scheme to generate interleaved encoded bits;
    a scrambler scrambling the interleaved encoded bits with a scrambling code to generate scrambled bits; and
    a modulator modulating the scrambled bits based on the modulation scheme to output at least one symbol.

8. The apparatus of claim 7, wherein a size of each set of rows is defined based on $Log_2 M$, where M denotes an integer value defined according to the modulation scheme.

9. The apparatus of claim 7, wherein one set of rows is one group of consecutive bits determined based on a modulation scheme,
    wherein the one group of consecutive bits is equal to one symbol, and
    wherein the number of groups is equal to the number of symbols for data transmission in one subframe.

10. A deinterleaving apparatus in a mobile communication system, the apparatus comprising:

a demodulator demodulating received symbols to output scrambled bits based on a modulation scheme;
a descrambler descrambling the scrambled bits according to a scrambling code to output interleaved encoded bits;
a deinterleaver deinterleaving the interleaved encoded bits by in a unit of at least one set of rows determined based on the modulation scheme to generate encoded bits; and
a decoder decoding the encoded bits to output a plurality of bits.

11. The apparatus of claim 10, wherein a size of each set of rows is defined based on $Log_2M$, where M denotes an integer value defined according to the modulation scheme.

12. The apparatus of claim 10, wherein one set of rows is one group of consecutive bits determined based on a modulation scheme,
wherein the one group of consecutive bits is equal to one symbol, and
wherein the number of groups is equal to the number of symbols for data transmission in one subframe.

13. An interleaving method to which time-first-mapping is applied in a mobile communication system, the method comprising:
encoding a plurality of bits to output encoded bits;
interleaving the encoded bits in a unit of at least one set of rows determined based on a modulation scheme to generate interleaved encoded bits;
scrambling the interleaved encoded bits with a scrambling code to generate scrambled bits; and
modulating the scrambled bits based on the modulation scheme to output at least one symbol.

14. The method of claim 13, wherein one set of rows is one group of consecutive bits determined based on a modulation scheme,
wherein the one group of consecutive bits is equal to one symbol, and
wherein the number of groups is equal to the number of symbols for data transmission in one subframe.

15. The method of claim 13, wherein the interleaved encoded bits are considered to be elements of a matrix having a size corresponding to a number of symbols for data transmission constituting one subframe.

16. The method of claim 15, wherein the symbols comprise Single Carrier—Frequency Division Multiple Access (SC-FDMA) symbols.

17. A deinterleaving method to which time-first-mapping is applied in a mobile communication system, the method comprising:
demodulating received symbols based on a modulation scheme to output scrambled bits;
descrambling the scrambled bits according to a scrambling code to output interleaved encoded bits;
deinterleaving the interleaved encoded bits in a unit of at least one set of row determined based on the modulation scheme to generate encoded bits; and
decoding the encoded bits to output a plurality of bits.

18. The method of claim 17, wherein one set of rows is one group of consecutive bits determined based on a modulation scheme,
wherein the one group of consecutive bits is equal to one symbol, and
wherein the number of groups is equal to the number of symbols for data transmission in one subframe.

19. The method of claim 17, wherein the interleaved encoded bits are considered to be elements of a matrix having a size corresponding to a number of symbols for data transmission constituting one subframe.

20. The method of claim 19, wherein the symbols comprise Single Carrier-Frequency Division Multiple Access (SC-FDMA) symbols.

21. An interleaving apparatus to which time-first-mapping is applied in a mobile communication system, the apparatus comprising:
an encoder encoding a plurality of bits to output encoded bits;
an interleaver interleaving the encoded bits in a unit of at least one set of rows determined based on the modulation scheme to generate interleaved encoded bits;
a scrambler scrambling the interleaved encoded bits with a scrambling code to generate scrambled bits; and
a modulator modulating the scrambled bits based on the modulation scheme to output at least one symbol.

22. The apparatus of claim 21, wherein one set of rows is one group of consecutive bits determined based on a modulation scheme,
wherein the one group of consecutive bits is equal to one symbol, and
wherein the number of groups is equal to the number of symbols for data transmission in one subframe.

23. The apparatus of claim 21, wherein the interleaved encoded bits are considered to be elements of a matrix having a size corresponding to a number of symbols for data transmission constituting one subframe.

24. The apparatus of claim 23, wherein the symbols comprise Single Carrier-Frequency Division Multiple Access (SC-FDMA) symbols.

25. An apparatus for deinterleaving a received signal to which time-first-mapping is applied in a mobile communication system, the apparatus comprising:
a demodulator demodulating received symbols based on a modulation scheme to output scrambled bits;
a descrambler descrambling the scrambled bits according to a scrambling code to output interleaved encoded bits;
a deinterleaver deinterleaving the interleaved encoded bits in a unit of at least one set of rows determined based on the modulation scheme to generate encoded bits; and
a decoder decoding the encoded bits to output a plurality of bits.

26. The apparatus of claim 25, wherein one set of rows is one group of consecutive bits determined based on a modulation scheme,
wherein the one group of consecutive bits is equal to one symbol, and
wherein the number of groups is equal to the number of symbols for data transmission in one subframe.

27. The apparatus of claim 25, wherein the interleaved encoded bits are considered to be elements of a matrix having a size corresponding to a number of symbols for data transmission constituting one subframe.

28. The apparatus of claim 27, wherein the symbols comprise Single Carrier-Frequency Division Multiple Access (SC-FDMA) symbols.

* * * * *